US008533538B2

(12) United States Patent
Chaudhuri et al.

(10) Patent No.: US 8,533,538 B2
(45) Date of Patent: Sep. 10, 2013

(54) METHOD AND APPARATUS FOR TRAINING A MEMORY SIGNAL VIA AN ERROR SIGNAL OF A MEMORY

(75) Inventors: Santanu Chaudhuri, Mountain View, CA (US); Joseph H. Salmon, Placerville, CA (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 476 days.

(21) Appl. No.: 12/824,675

(22) Filed: Jun. 28, 2010

(65) Prior Publication Data

US 2011/0320867 A1 Dec. 29, 2011

(51) Int. Cl.
*G06F 11/00* (2006.01)

(52) U.S. Cl.
USPC .............. 714/48; 714/2; 714/6.1; 714/6.21; 714/42

(58) Field of Classification Search
USPC ........................ 714/48, 6.1, 6.2, 2, 6.21, 42
See application file for complete search history.

(56) References Cited

U.S. PATENT DOCUMENTS

| 4,641,020 A * | 2/1987 | Iwai ............................ 250/201.5 |
| 2002/0128732 A1 * | 9/2002 | Dozono et al. ................... 700/35 |
| 2003/0026162 A1 * | 2/2003 | Matsui ............................ 365/233 |
| 2003/0206365 A1 * | 11/2003 | Ho et al. ...................... 360/78.04 |
| 2004/0103226 A1 * | 5/2004 | Johnson et al. ................. 710/52 |
| 2005/0248305 A1 * | 11/2005 | DeCusatis et al. ............ 318/606 |
| 2006/0143491 A1 * | 6/2006 | Lin et al. ....................... 713/600 |
| 2006/0181444 A1 * | 8/2006 | Wallner et al. ................. 341/101 |
| 2008/0065967 A1 * | 3/2008 | Talbot ............................ 714/781 |
| 2009/0187794 A1 * | 7/2009 | Kim et al. ........................ 714/43 |
| 2009/0238025 A1 * | 9/2009 | Shaeffer et al. ............ 365/233.1 |
| 2009/0316474 A1 * | 12/2009 | Cho et al. ....................... 365/163 |
| 2009/0327800 A1 * | 12/2009 | Kim ................................ 714/5 |
| 2010/0007770 A1 * | 1/2010 | Koganezawa et al. ... 348/231.99 |
| 2010/0067314 A1 * | 3/2010 | Ware ......................... 365/189.15 |
| 2010/0083028 A1 * | 4/2010 | Oh ................................ 713/601 |
| 2010/0091537 A1 * | 4/2010 | Best et al. ....................... 365/51 |

(Continued)

FOREIGN PATENT DOCUMENTS

| JP | 2004152378 | 5/2004 |
| JP | 2008192309 | 8/2008 |
| JP | 2008234699 | 10/2008 |
| JP | 2010009642 | 1/2010 |

OTHER PUBLICATIONS

International Search Report and Written Opinion mailed Feb. 9, 2012 for Int'l Application No. PCT/US2011/041050.

(Continued)

*Primary Examiner* — Loan L. T. Truong

(74) *Attorney, Agent, or Firm* — Blakely, Sokoloff, Taylor & Zafman LLP

(57) ABSTRACT

Described herein is a method and an apparatus for training a memory signal via an error signal of a memory. The method comprises transmitting from a memory controller a command-address (C/A) signal to a memory module; determining by the memory controller an error in the memory module via an error signal from an error pin of the memory module, the error associated with the C/A signal transmitted to the memory module; and modifying by the memory controller the C/A signal in response to determining an error in the memory module, wherein the error pin is a parity error pin of the memory module, and wherein the memory module comprises a Double Data Rate 4 (DDR4) interface.

28 Claims, 7 Drawing Sheets

(56) References Cited

U.S. PATENT DOCUMENTS

| | | | |
|---|---|---|---|
| 2010/0135100 A1* | 6/2010 | Chiu | 365/233.11 |
| 2010/0162037 A1* | 6/2010 | Maule et al. | 714/5 |
| 2010/0228891 A1* | 9/2010 | Talbot | 710/14 |
| 2010/0332895 A1* | 12/2010 | Billing et al. | 714/8 |

OTHER PUBLICATIONS

*Notification Concerning Transmittal of International Preliminary Report on Patentability* mailed Jan. 10, 2013 for International Patent Application No. PCT/US2011/041050.

\* cited by examiner

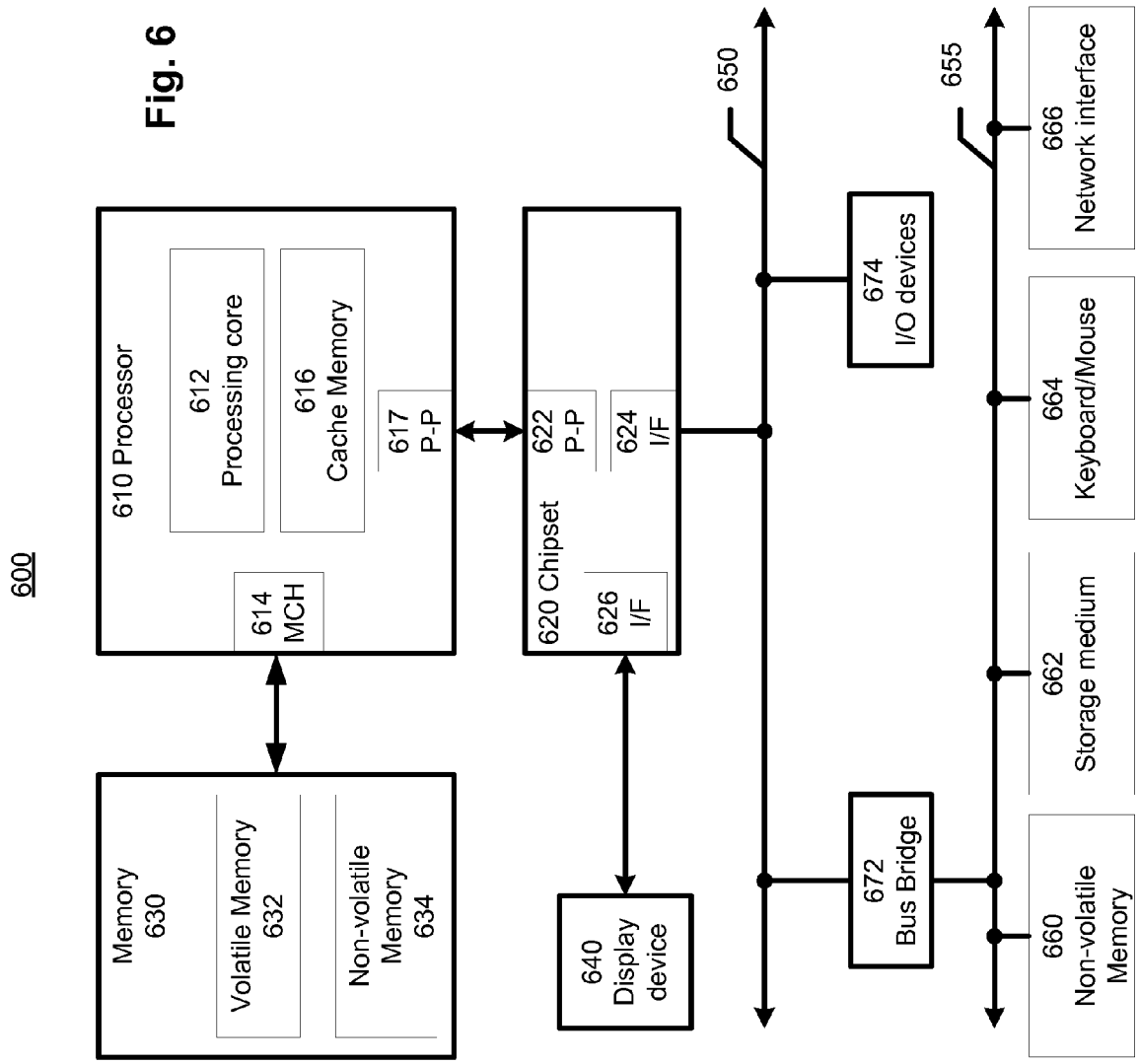

METHOD AND APPARATUS FOR TRAINING A MEMORY SIGNAL VIA AN ERROR SIGNAL OF A MEMORY

FIELD OF THE INVENTION

Embodiments of the invention relate generally to the field of memory controllers. More particularly, embodiments of the invention relate to a method and an apparatus for training a command-address (C/A) memory signal via a C/A parity error signal from a memory.

BACKGROUND

In a typical memory system of a computer system, a memory controller facilitates the access of a memory module in the computer system. The memory module may include one or more memories. These one or more memories are also called ranks. The memory controller transmits a host of signals to the ranks including address signals, control signals, clock signals, etc., to access data from the ranks or to send data to the ranks. To send and receive correct data to and from the ranks, the memory controller trains (modifies) the command-address (C/A) signals with respect to a clock signal.

Typically, the memory controller trains the C/A signals by transmitting a particular C/A signal with respect to a clock signal to the ranks and then analyzing a response from each rank to ascertain if the rank correctly received the particular C/A signal. Upon a successful/correct response from the rank, the memory controller delays the phase of the particular C/A signal with respect to the clock signal and then re-transmits the delayed particular C/A signal with a delayed phase to the rank. The memory controller then analyzes a response from the rank to ascertain if the rank correctly received the delayed particular C/A signal. If no response (or an incorrect response) is received from the rank to the memory controller, the memory module transitions to an unknown state (indeterminate state) resulting in a non-functional memory module.

In case of a Double Data Rate 3 (DDR3) memory interface between the memory controller and the memory module having the ranks, the unknown state of the memory module is resolved to a known state by a Joint Electron Devices Engineering Council (JEDEC) standardized initialization process. The JEDEC standardized initialization process results in resetting the memories.

The JEDEC standardized initialization process is a time consuming process that takes several milliseconds for the memory controller to restore the memory module to a known functional state. As computing requirements by users are becoming more memory usage intensive, any error in the memory system e.g., error caused by a C/A signal (with a phase with respect to a clock signal that results in accessing incorrect data from the memory module to the memory controller) results in loss of time due to the time consuming JEDEC standardized initialization process which is required for the DDR3 based memory interface. Furthermore, as demand for faster boot-up of memory systems is increasing, such errors may lead to intolerable lengthening of boot-up time as experienced in a DDR3 based memory interface.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 6 is computer system to implement the methods for training the C/A signal in response to an error signal from the memory module, according to one embodiment of the invention.

DETAILED DESCRIPTION

Embodiments of the invention relate to a method and an apparatus for training a memory signal via an error signal of a memory.

In one embodiment, the memory is part of a memory module having one or more memories. In one embodiment the memory signal is a command-address (C/A) signal and the corresponding error signal is a parity error signal. In one embodiment, the voltage level of the parity error signal indicates if there is an error in the memory module requiring the C/A signal to be re-trained to resolve the error without initiating a JEDEC standardized initialization process. In one embodiment of the invention, the memory module includes a Synchronous Dynamic Random Access Memory (SDRAM), Dynamic Random Access Memory (DRAM), RAMBUS Dynamic Random Access Memory (RDRAM), double-data-rate four SDRAM (DDR4), and any other type of random access memory device.

So as not to obscure the embodiments of the invention, the embodiments herein are discussed with reference to a Dual In-Line Memory Module (DIMM) having one or more SDRAMs, which are also called ranks, where the DIMM is communicatively coupled to the memory controller via a DDR4 I/O interface. In one embodiment, the DIMM comprises SDRAM(s) arranged as one, two, or four ranks. In other embodiments, other arrangements of SDRAM ranks may be used. However, the above embodiments are not limiting embodiments. Other embodiments having different memory modules (other than the DIMM), ranks without memory modules, and other I/O interfaces (newer than the DDR4 I/O interface) can be used without changing the essence of the invention.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme, e.g., differential pair, single-ended, etc.

Figure 1:
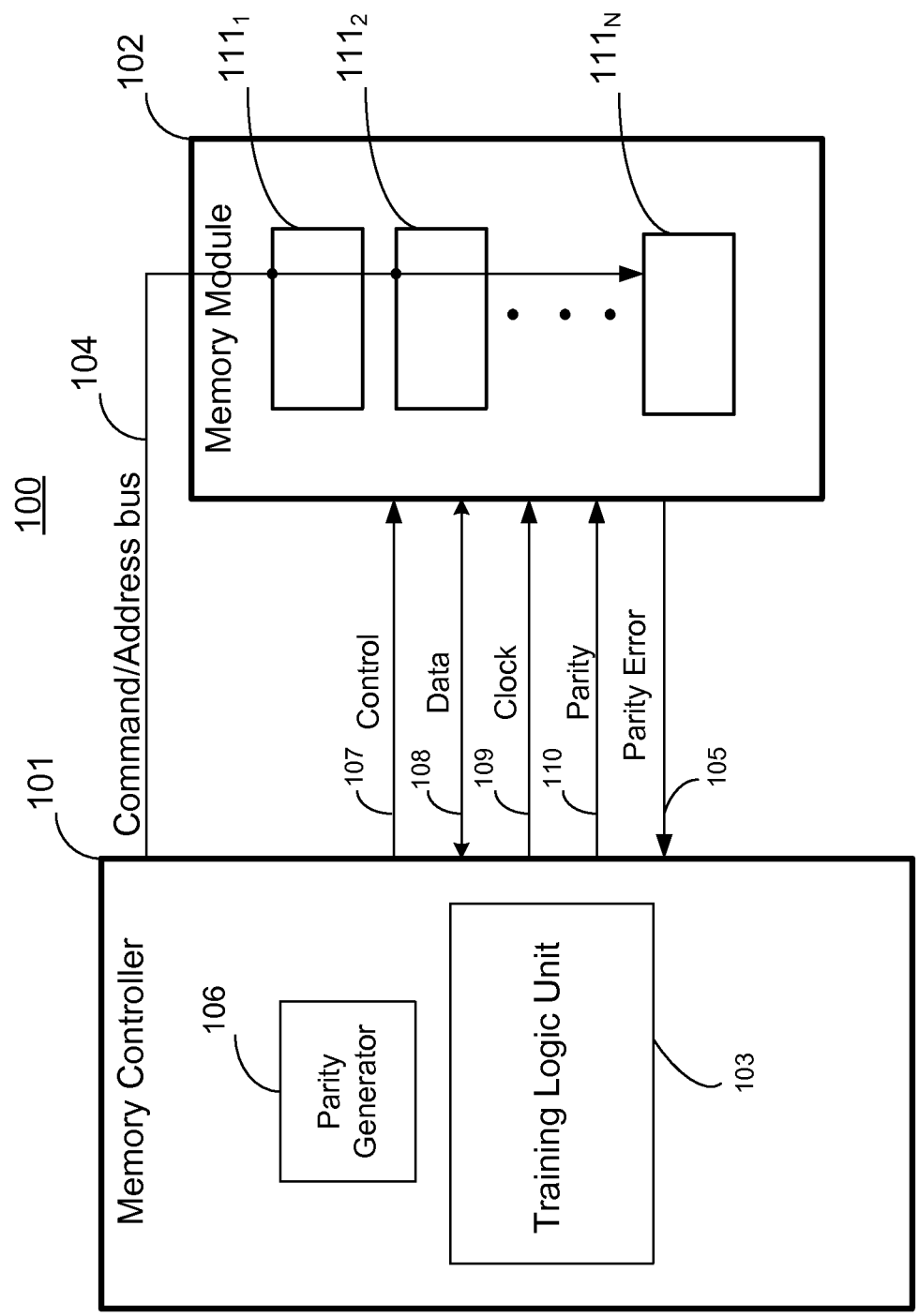
FIG. 1 is a memory system comprising a memory controller operable to train a command-address (C/A) signal via an error signal, and a memory module coupled to the memory controller, according to one embodiment of the invention.

FIG. 1 is a memory system 100 comprising a memory controller 101 operable to train a C/A signal 104 via an error signal 105, and a memory module 102 coupled to the memory controller, according to one embodiment of the invention. In one embodiment, the memory controller 101 is integrated within a microprocessor (CPU). In other embodiments, the memory controller 101 is a separate integrated circuit (IC) on the motherboard and is coupled to the CPU (not shown) and the memory module 102. In one embodiment of the invention, the memory module 102 includes DRAMs ($111_{1-N}$), register devices, buffer devices, etc. In one embodiment, the memory controller 101 communicates with the memory module 102 via signals including, but not limited to, C/A signal 104, C/A parity error signal 105, control signals 107, data signals 108, clock signals 109, parity signal 110, and any other signals to cause communication between the memory controller 101 and the memory module 102.

In one embodiment of the invention, when the memory controller 101 transmits a command signal (e.g., read, write, etc.,) to the memory module 102, the memory controller 101 computes a parity of address signal bits and command signal bits of the command signal via a parity generator 106. In one embodiment, the parity generator 106 determines a parity bit signal 110 based on an even or odd parity of a combination of the computed parity and the parity bit signal. In one embodiment, the parity generator 106 provides the parity for the signals including but not limited to, row address strobe (RAS) signal, column address strobe (CAS) signal, write enable (WE) signal, address bus signals, and bank select signals of the memory module 102.

In one embodiment, the memory controller 101 provides the parity bit signal as one of the parity signals 110 when a command is sent/transmitted to the memory module 102 from the memory controller 101. In one embodiment, the memory module 102, upon receiving a command signal and its corresponding parity signal, is operable to detect or determine if the received command signal has any C/A parity error. The term command signal and command are herein used interchangeably.

In one embodiment, when the memory module 102 detects a parity error in the received command signal, it ignores the received command signal and stores the command bits and the address bits of the received command signal in a mode register. In one embodiment, the memory module 102 asserts an error signal 105 to the memory controller 101 when the parity error in the received command signal is detected.

In one embodiment, the error signal 105 is a parity error signal which is feedback from the memory module 102 to the memory controller 101. In one embodiment, the parity error signal 105 is an ALERT# signal of the DDR4 I/O interface between the memory controller 101 and the memory module 102.

In one embodiment, the memory controller 101 comprises a training logic unit 103 operable to receive the parity error signal 105 from the memory module 102 and to determine from the parity error signal 105 whether a parity error is present in the received command. In one embodiment, the parity error signal 105 is a C/A parity error signal. In one embodiment, an error handling mechanism is triggered to recover from the errant command (because of the parity error) and the training logic unit 103 begins to train the C/A signal 104 without initiating a reboot of the memory system 100 or a JEDEC standardized initialization process.

So as not to obscure the embodiments of the invention, the embodiments herein refer to the parity error signal 105 as the C/A parity error signal 105 to indicate that the parity error is a C/A parity error.

With C/A parity support in the memory module 102, the performance of the memory system 100 is improved because the memory system 100 does not need to be rebooted nor does a JEDEC standardized initialization process need to be initiated in order to recover the memory system 100 from an errant command received by the memory module 102 and to retrain the C/A signal 104. The training process of the C/A signal 104 via the embodiments herein is much faster than a memory system having no support for the C/A parity error signal 105.

For example, the training of the C/A signal 104 is completed via the embodiments herein within a few nanoseconds (e.g., about 200 nanoseconds) compared to milliseconds or more to train the C/A signals with a memory module having no support for C/A parity i.e., an order magnitude of difference in speed of training the C/A signal with the embodiments discussed herein. The faster training of the C/A signal 104 is because the reset sequence is avoided which may take up to a few seconds if initiated via software e.g., Basic Input-Output System (BIOS).

While the memory system 100 is illustrated as a fly-by memory topology with a serial C/A signal 104, other topologies may be used without changing the essence of the embodiments of the invention.

Figure 2:
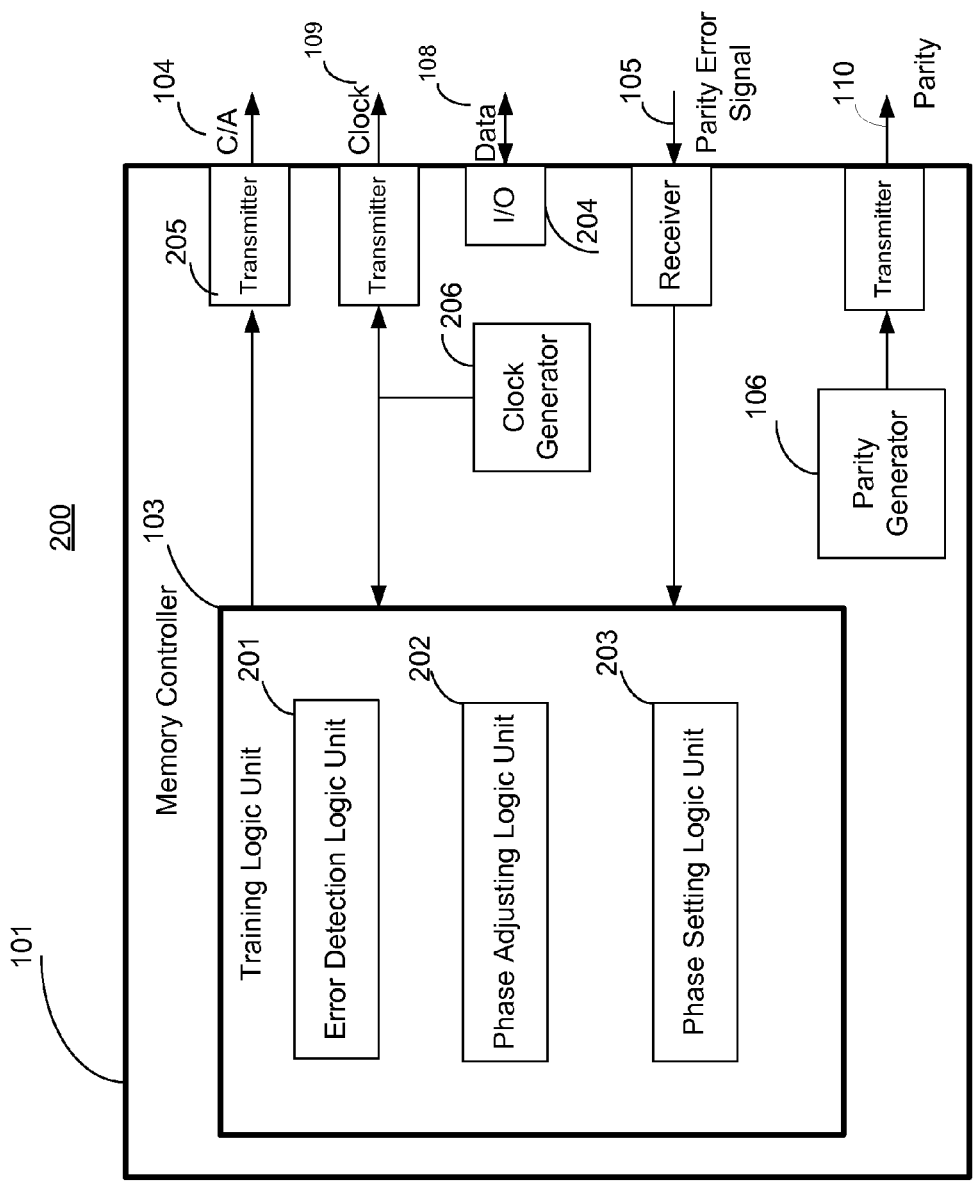
FIG. 2 is a memory controller operable to train the C/A signal via an error signal, according to one embodiment of the invention.

FIG. 2 illustrates a logic level diagram 200 of the memory controller 101 operable to train the C/A signal 104 via the C/A parity error signal 105, according to one embodiment of the invention. The memory controller 101 comprises the training logic unit 103 which is operable to train the C/A signal 104 with respect to a clock signal 109. In one embodiment, the clock signal 109 is generated by a clock generator 206. In one embodiment, the training logic unit 103 comprises an Error Detection Logic 201 which is operable to detect a C/A parity error signal 105 from the memory module 102 of FIG. 1.

In one embodiment, the memory controller 101 further comprises I/O transceivers 204 which are operable to transmit and receive data signals 108 to and from the memory module 102. In one embodiment, the I/O transceivers 204 are DDR4 based I/O transceivers. In one embodiment, the C/A signal 104 is transmitted by the memory controller 101 to the ranks $111_{1-N}$ of the memory module 102 via a DDR4 based I/O interface. In one embodiment, the parity error signal 105 is received by the memory controller 101 from the memory module 102 via a receiver.

In one embodiment, the training logic unit 103 also comprises a phase adjusting logic unit 202 which is operable to adjust a phase of the C/A signal 104 with respect to the clock signal 109. In another embodiment, the phase adjusting logic unit 202 is operable to adjust the phase of the clock signal 109 relative to a phase of the C/A signal 104. In one embodiment, the phase of the C/A signal 104 and/or the clock signal 109 is adjusted by delaying the C/A signal 104 and/or the clock signal 109 with respect to one another via a delay unit (not shown). In one embodiment, the delay unit comprises a delay locked loop (DLL) with phase interpolators (PI) to adjust the phase of the C/A signal 104 and/or the clock signal 109 with respect to one another.

The term delay herein refers to positive and negative delay in time domain, where positive delay refers to adding a delay in time domain to a signal with respect to another signal while negative delay refers to pulling in a signal in time domain with respect to another signal. So as not to obscure the essence of the embodiments, details of how the phases of either the C/A signal 104 or the clock signal 109 are adjusted (delayed positively and/or negatively) with respect to one another is not discussed herein.

In one embodiment, the phase adjusting logic unit 202 is operable to adjust the C/A signal 104 by delaying (positively and/or negatively) a phase of the C/A signal 104 with respect to the clock signal 109 to generate an adjusted C/A signal. In one embodiment, the adjusted C/A signal (also referred to as the signal 104) is transmitted via a transmitter to the memory module 102. In one embodiment, in response to the transmitted adjusted C/A signal 104, the C/A parity signal 105 is monitored by the error detection logic unit 201. If no error is detected by the error detection logic unit 201, the phase adjusting logic unit 202 further delays a phase of the adjusted C/A signal 104 to generate another adjusted C/A signal (also referred to as 104) which is then transmitted to the ranks $111_{1-N}$ of the memory module 102. In the above embodiment, the process of delaying (positively and/or negatively) the phase of the C/A signal 104 with respect to the clock signal 109 is repeated till the error detection logic unit 201 detects an error in the C/A parity signal 105. At that point, the training logic unit 103 determines a phase setting of the C/A signal 104 and the training of the C/A signal 104 completes.

In one embodiment, the training logic unit 103 further comprises a phase setting logic unit 203 which is operable to compute an average of phases of all correctly received C/A signals transmitted via transmitters 205 to the memory module 102, where the average of phases is used to compute a phase setting for C/A signals 104.

Figure 3:
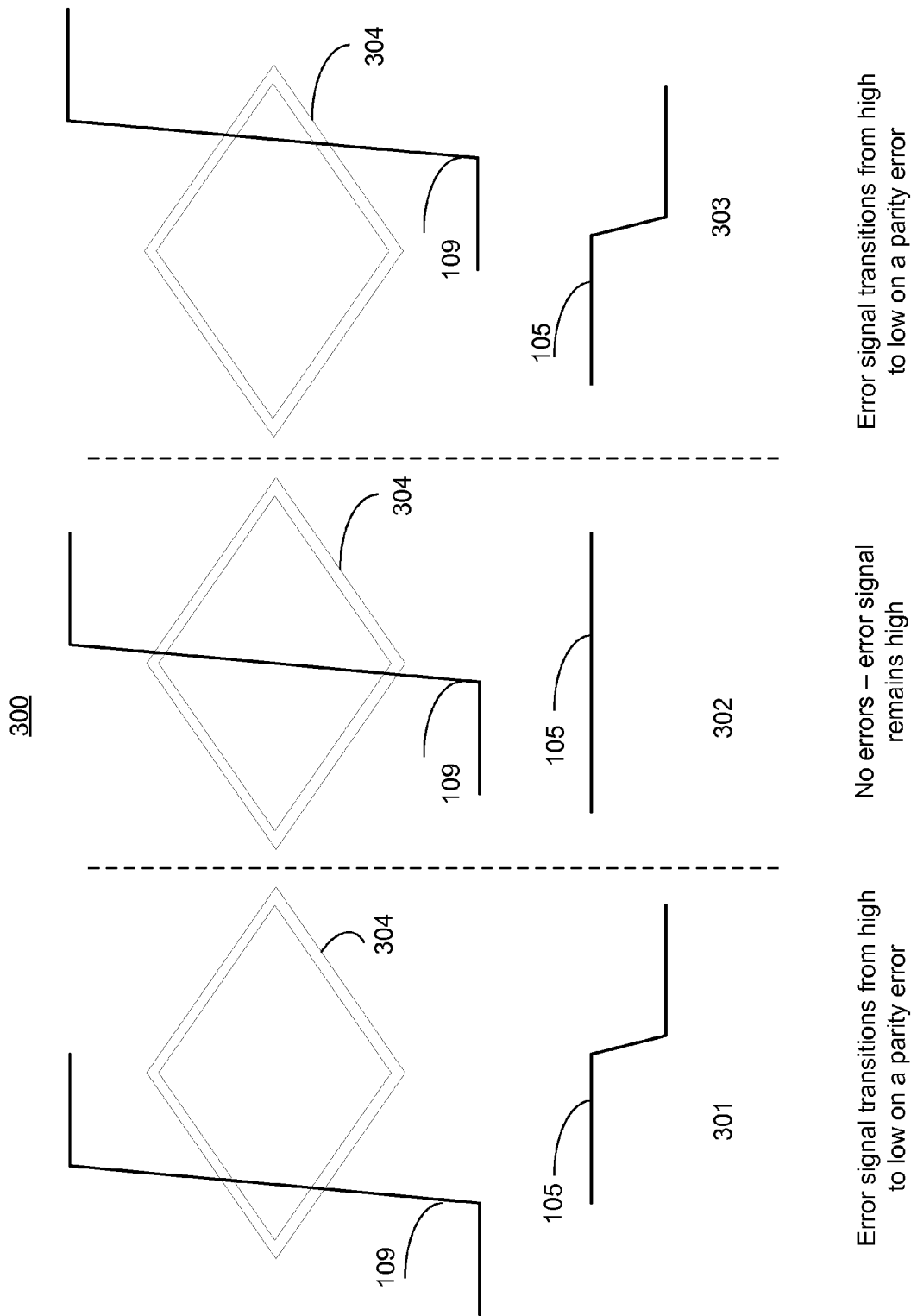
FIG. 3 illustrates the response of the parity error signal used for training the C/A signal with respect to a clock signal, according to one embodiment of the invention.

FIG. 3 illustrates the process 300 of training the C/A signal 104 with respect to the clock signal 109, according to one embodiment of the invention. The process 300 is illustrated with reference to embodiments of FIG. 1 and FIG. 2. The process 300 is divided into three scenarios: 301, 302, and 303. To reduce redundancy in describing the three scenarios, the process 300 shows positively delaying the C/A signal 304 relative to the clock signal 109. The C/A signal 304 is also delayed negatively (i.e., pulled-in) in time domain (not shown) with respect to the clock signal 109 during the training process.

In the first scenario 301, the C/A signal 304 (which is the same as signal 104 but illustrated as an eye diagram) is located to the left of the clock signal 109 by the phase adjusting logic unit 202 of FIG. 2. In this scenario, the C/A parity error signal 105 transitions from a logical high level to a logical low level to indicate that there is a C/A parity error. In one embodiment, the phase setting logic unit 203 keeps track of the delay setting to the C/A signal 304 that resulted in an error indicated by the C/A parity error signal 105.

In the second scenario 302, the C/A signal 304 is adjusted by the phase adjusting logic unit 202 so that the transition point of the clock signal 109 is located in the middle of the eye of the C/A signal 304. In this scenario, the C/A parity error signal 105 remains constant which indicates no error in the C/A parity. In one embodiment, the phase setting logic unit 203 keeps track of the delay setting to the C/A signal 304 that resulted in no error indicated by the C/A parity error signal 105.

In the third scenario 303, the C/A signal 304 is adjusted by the phase adjusting logic unit 202 so that the transition point of the clock signal 109 is located to the right of the eye of the C/A signal 304. In this scenario, the C/A parity error signal 105 transitions from a logical high level to a logical low level which indicates an error in the C/A parity. In one embodiment, the phase setting logic unit 203 keeps track of the delay setting to the C/A signal 304 that resulted in an error indicated by the C/A parity error signal 105.

While the above process 300 is illustrated with the C/A parity error signal 105 transitioning from a logical high level to a logical low level to indicate a C/A parity error, alternative embodiments may indicate a C/A parity error when the C/A parity error signal 105 transitions from a logical low level to a logical high level without changing the essence of the embodiments of the invention.

Referring back to FIG. 2, in one embodiment, the phase setting logic unit 203 is operable to compute an average of phases of all correctly received C/A signals transmitted to the memory module 102, where the average of phases is used to compute a new phase setting for C/A signals 104 resulting in training the C/A signal 104 with respect to the clock signal 109. In another embodiment, the phase setting logic unit 203 is operable to compute a phase setting that provides the most timing margin for the C/A signal 104 relative to the clock signal 109. In one embodiment, the phase setting logic unit 203 is operable to compute a phase setting that provides the most voltage margin for input receivers of the memories receiving the C/A signal 104 by adjusting (raising or lowering) the Voltage Reference (Vref) level of the input receivers receiving the C/A signal 104.

In other embodiments, different criteria can be used to assign a phase setting to the C/A signal 104 with respect to the clock signal 109 in view of the phases of the C/A signal 104 that result in no C/A parity error. In one embodiment, once a phase setting is computed by the phase setting logic unit 203, the phase setting is assigned to the C/A signal 104 for all memories (also referred to as ranks) of the memory module.

Figure 4:
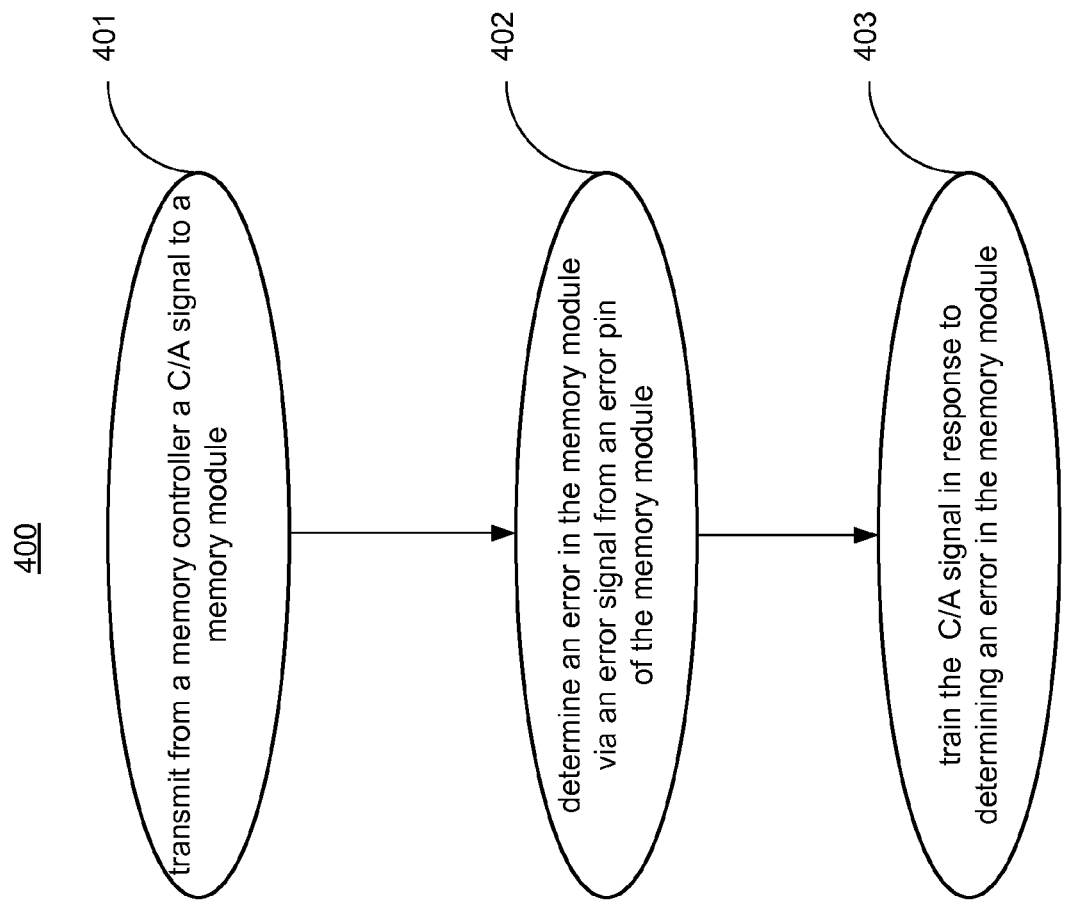
FIG. 4 is a high level method flowchart for training the C/A signal in response to an error signal from the memory module, according to one embodiment of the invention.

FIG. 4 is a high level method flowchart 400 for training the C/A signal 104 in response to the error signal 105, according to one embodiment of the invention. The flowchart is discussed with respect to the embodiments of FIGS. 1-2.

At block 401, the memory controller 101 transmits the C/A signal 104 to the memory module 102. A person skilled in the art would appreciate that the same C/A signal 104 is received by all memories (also referred to as ranks) in the memory module 102. At block 402, the memory controller 101 determines via the error detection logic unit 201 an error in the memory module 102 from an error signal (parity error signal 105) via an error pin of the memory module 102, wherein the error is associated with the C/A signal 104 transmitted to the memory module 102. As mentioned above, in one embodiment the error pin corresponds to a parity error pin. In one embodiment, the error pin is an ALERT# pin of a DDR4 I/O interface. At block 403, the memory controller 101 trains the C/A signal 104 in response to determining an error in the memory module 102.

Figure 5A:
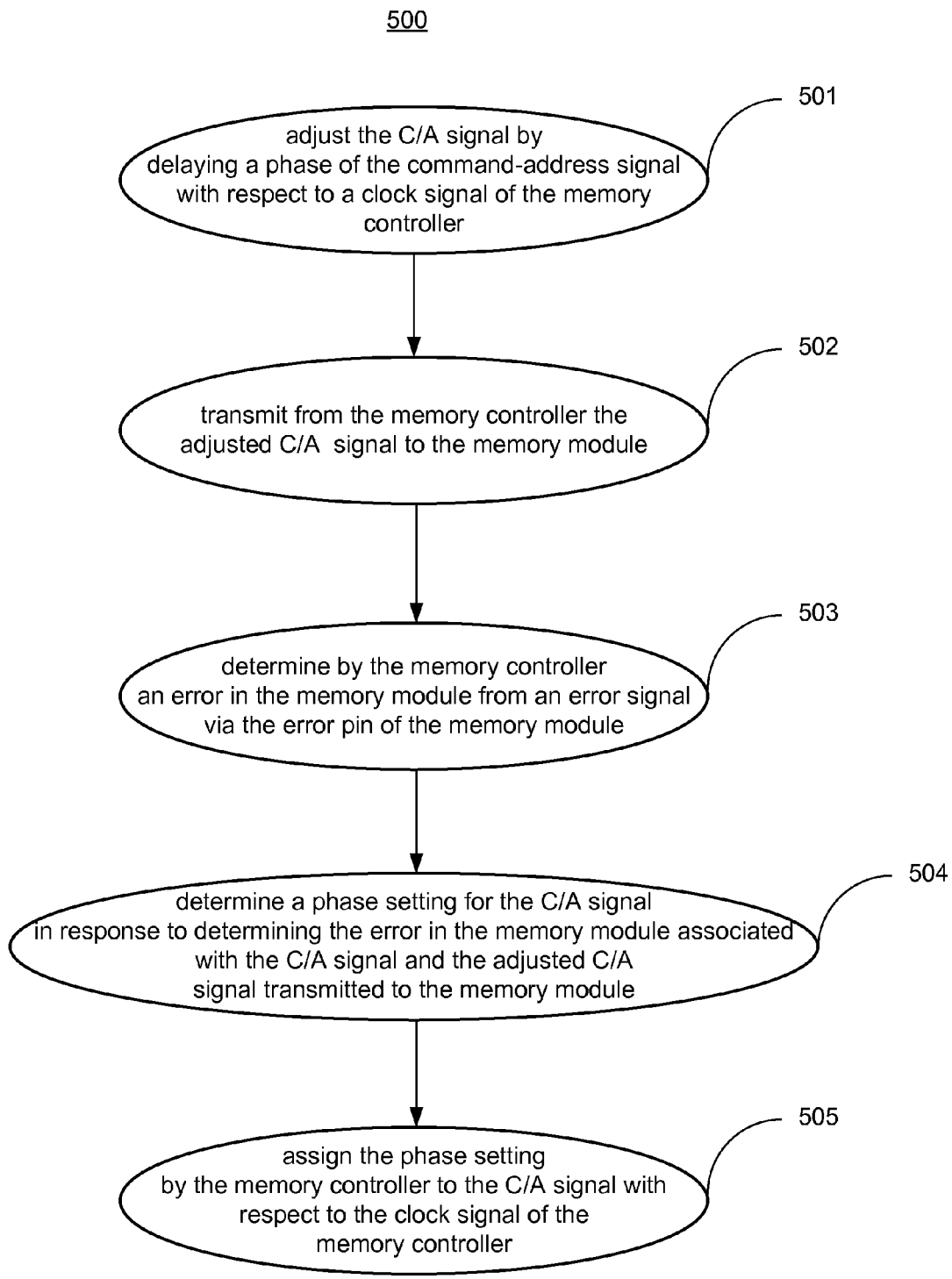
FIG. 5A is a detailed method flowchart for training the C/A signal in response to an error signal from the memory module, according to one embodiment of the invention.

FIG. 5A is a detailed method flowchart 500 for training (modifying) the C/A signal 104 in response to the error signal 105, according to one embodiment of the invention. The flowchart is discussed with respect to the embodiments of FIGS. 1-3.

At block 501, the memory controller 101 trains the C/A signal 104 by adjusting the C/A signal 104. As discussed above, the C/A signal 104 is adjusted by a phase adjusting logic unit 202 which is operable to delay a phase of the C/A signal with respect to the clock signal 109. At block 502, the memory controller 101 transmits the adjusted C/A signal 104 to the memory module 102. At block 503, the memory controller 101 determines an error in the memory module 102 from an error signal via an error pin of the memory module 102, where the error is associated with the adjusted C/A signal transmitted to the memory module 102.

At block 504, the phase setting logic unit 203 determines a phase setting for the C/A signal in response to determining the error in the memory module 102 (which is discussed with reference to FIG. 2 and FIG. 3). In one embodiment, the phase setting indicates a setting of the phase interpolators (discussed with reference to FIG. 2). Referring back to FIG. 5A, at block 505, the phase setting logic unit 203 computes an average of the phases of all correctly received C/A signals 104 transmitted by the memory controller 101 to the memory module 102.

In one embodiment, a control signal is trained prior to training the C/A signal 104 to isolate the errors detected during the training of the C/A signal 104—the errors are not caused by the control signal because it is trained prior to training of the C/A signal 104. In one embodiment, the control signal is a chip-select signal.

In one embodiment, the method of training the control signal comprises positioning a clock signal transition edge at a time point midway through a phase of the control signal. In one embodiment, in response to the positioning of the clock signal transition edge, the method of training the control signal further comprises issuing by the memory controller 101 the control signal to the memory module in response to the positioning. In one embodiment, in response to issuing the control signal by the memory controller, the memory controller 101 adjusts the phase of the control signal relative to the clock signal transition edge so long as the control signal is correctly received by the memory module.

In one embodiment, in response to adjusting the phase of the control signal, the memory controller 101 determines the phase of the control signal resulting in an incorrectly received control signal by the memory module. In one embodiment, in response to determining the phase of the control signal, the memory controller 101 positions the phase of the control signal relative to the clock signal transition edge. In such an embodiment, the positioning of the phase of the control signal relative to the clock signal transition edge comprises positioning the phase of the control signal based on an average of all adjusted phases of the control signal correctly received by the memory module.

Figure 5B:
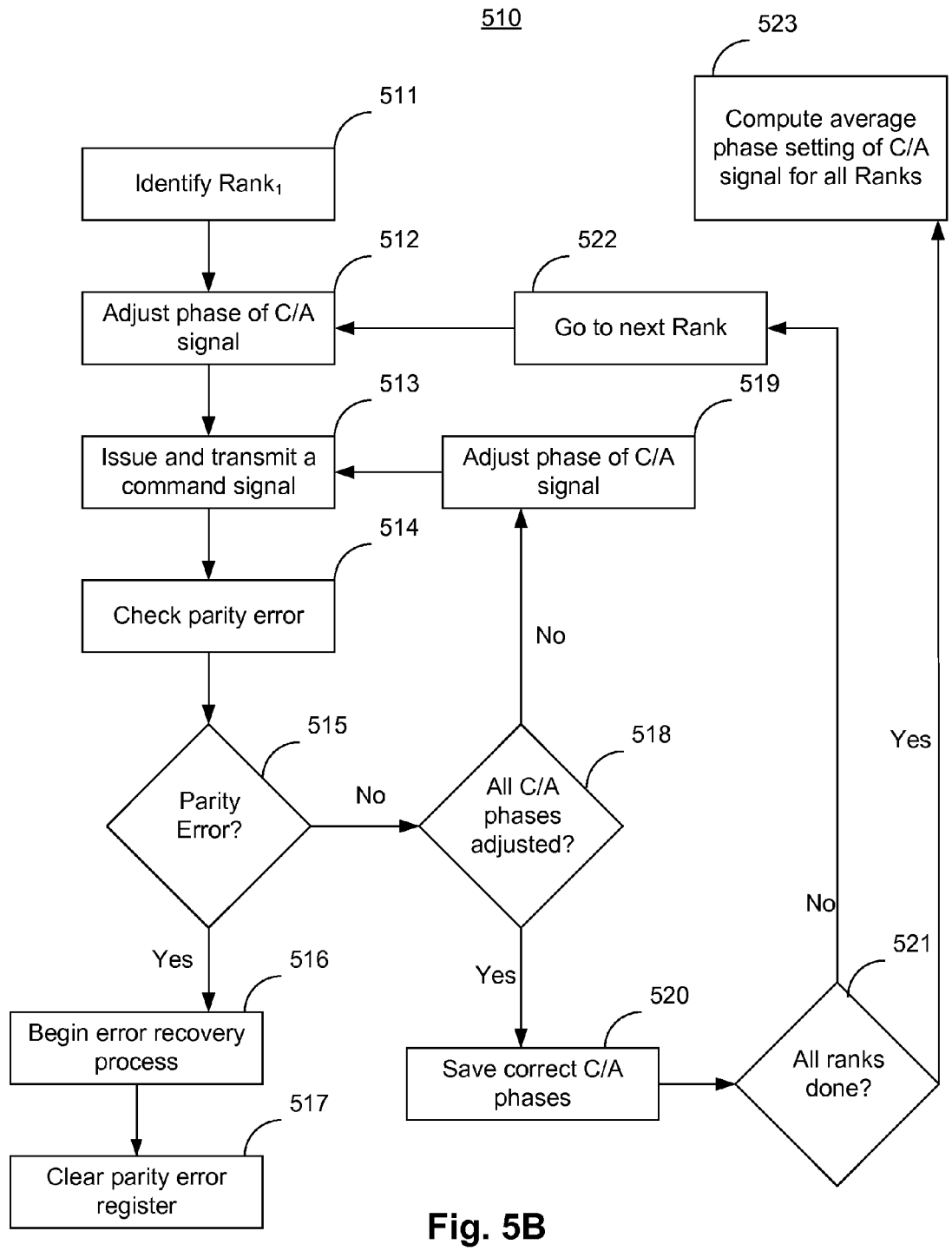
FIG. 5B is another flowchart for training the C/A signal for a memory module having multiple ranks, according to one embodiment of the invention.

While the methods of FIG. 4 and FIG. 5A are discussed for a single memory unit (rank) in the memory module 102, the methods are repeated for each rank ($111_{1-N}$ of FIG. 1) in the memory module 102 as shown by FIG. 5B to achieve a common trained phase setting for the C/A signal which is applied to all ranks ($111_{1-N}$ of FIG. 1) in the memory module 102.

FIG. 5B illustrates a method flow chart 510 for training the C/A signal 104 for a memory module having multiple ranks (e.g., $111_{1-N}$ of FIG. 1), according to one embodiment of the invention. The flowchart is discussed with respect to the embodiments of FIGS. 1-2.

At block 511, the memory controller 101 identifies the first rank $111_1$ of the memory module 102 for C/A training purposes. As mentioned above, C/A training process comprises adjusting by a phase adjusting logic unit 202 the phase of the C/A signal 104 with respect to a clock signal 109. At block 512, the phase adjusting logic unit 202 sets or adjusts the phase of the C/A signal 104 with respect to a clock signal 109 for the first selected rank $111_1$ of the memory module 102. At block 513, the adjusted C/A signal (e.g., a read command signal with its corresponding address) is transmitted by a transmitter to the first rank $111_1$ of the memory module 102.

At blocks 514 and 515, the error detection logic unit 201 determines if the parity error signal 105 indicates a parity error caused by the adjusted phase of the C/A signal 104. If a parity error is detected by the error detection logic unit 201, then at block 516 an error recovery process begins. As part of the error recovery process, at block 517, a parity error register within the memory controller is cleared or reset by a reset logic unit (not shown) of the memory controller 101 and the process moves block 518. At block 518, the memory controller determines if all phases of the C/A signal 104 have been adjusted by the phase adjusting logic unit 202.

If all the phases of the C/A signal 104 have been adjusted and parity error for each adjusted phase has been determined by the memory controller 101, then at block 520 all valid or correct C/A phases are saved in memory or a register for the selected ranks $111_1$ of the memory module 102. As mentioned above with reference to FIG. 3, valid or correct C/A phases refer to the C/A phases that resulted in a logical high state of the parity error signal 105.

If all phases of the C/A signal have not been adjusted by the phase adjusting logic unit 202, then at block 519 the phase adjusting logic unit 202 adjusts the phase of the C/A signal 104 by delaying the phase of the C/A signal 104 relative to the clock signal 109. The process control then transfers to block 513 at which the C/A signal 104 (e.g., a read command signal with its corresponding address) is transmitted by a transmitter to the first rank $111_1$ of the memory module 102. The above process 513-519 is repeated till all phases of the C/A signal 104 have been adjusted and corresponding phase error signal 105 checked for any parity error. Once all phases of the C/A signal 104 have been adjusted and corresponding phase error signal 105 checked for any parity error, the C/A signal 104 training for the first rank $111_1$ is complete. As mentioned above, adjusting the phase of the C/A signal 104 refers to delaying positively and/or negatively the phase of the C/A signal 104 relative to the clock signal 109.

At block 521, the memory controller 101 determines if the training of the C/A signal 104 is complete for all ranks $111_{1-N}$ of the memory module 102. If the training of the C/A signal 104 for any rank of the memory module has not yet completed, then that rank is identified at block 522. The process of training the C/A signal 104 for that rank begins from block 512 as discussed above with reference to training the C/A signal 104 for rank $111_1$. If C/A signal training is complete for all ranks $111_{1-N}$ of the memory module 102, then at block 523 the phase setting logic unit 203 of the memory controller 101 computes a setting for the phase of the C/A signal 104 for all ranks $111_{1-N}$. Such a computed phase of the C/A signal 104 allows the C/A to work correctly for all ranks $111_{1-N}$.

In one embodiment, the phase setting logic computes an optimum setting for the phase of the C/A signal 104 to be used for all ranks $111_{1-N}$. As discussed with reference to the embodiment of FIG. 2, the phase setting logic unit 203 computes an average setting as the optimum setting for the phase of the C/A signal 104 for all ranks $111_{1-N}$. The computed setting for the phase of the C/A signal 104 is then set for the memory module 102 having ranks $111_{1-N}$. At that point, the training for the C/A signal 104 is complete without having to initiate a time consuming JEDEC standardized initialization process. As mentioned above, the C/A training process of the embodiments herein is an order of magnitude faster than the C/A training process that requires a system reboot and/or a JEDEC standardized initialization process.

Embodiments of the invention are also implemented via programmable computer-executable instructions stored on a machine-readable storage medium. For example, methods of FIGS. 3-4 and FIGS. 5A-B are programmable and executable by a computer. The machine-readable storage medium may include, but is not limited to, flash memory, optical disks, CD-ROMs, DVD ROMs, RAMs, EPROMs, EEPROMs, magnetic or optical cards, or other type of machine-readable storage media suitable for storing electronic or computer-executable instructions. For example, embodiments of the invention may be downloaded as a computer program which may be transferred from a remote computer (e.g., a server) to a requesting computer (e.g., a client) by way of data signals via a communication link (e.g., a modem or network connection).

FIG. 6 illustrates a system 600 to implement the methods disclosed herein, according to one embodiment of the invention. In one embodiment, the system 600 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 600 used to implement the methods disclosed herein may be a system on a chip (SOC) system.

In one embodiment, the processor 610 has a processing core 612 to execute instructions of the system 600. In one embodiment, the processing core 612 includes, but is not limited to, pre-fetch logic to fetch instructions, decode logic to decode the instructions, execution logic to execute instructions and the like. In one embodiment, the processor 610 has a cache memory 616 to cache instructions and/or data of the system 600. In one embodiment, the cache stores the instructions to execute the method of FIGS. 3-4 and FIGS. 5A-B. In another embodiment of the invention, the cache memory 616 includes level one, level two and level three, cache memory, or any other configuration of the cache memory within the processor 610.

The memory controller 101, which is also referred to as the memory control hub (MCH) 614, is operable to perform functions that enable the processor 610 to access and communicate with a memory 630 that includes a volatile memory 632 and/or a non-volatile memory 634. The volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, NAND flash memory, phase change memory (PCM), read only memory (ROM), electrically erasable programmable read only memory (EEPROM), or any other type of non-volatile memory device.

The memory 630 stores information and instructions to be executed by the processor 610. In one embodiment, the memory 630 may also store temporary variables or other intermediate information while the processor 610 is executing instructions. In one embodiment, the chipset 620 connects with the processor 610 via Point-to-Point (PtP) interfaces 617 and 622. In one embodiment, the chipset 620 enables the processor 610 to connect to other modules in the system 600. In one embodiment of the invention, the interfaces 617 and 622 operate in accordance with a PtP communication protocol such as the Intel® QuickPath Interconnect (QPI) or the like.

In one embodiment, the chipset 620 connects to a display device 640 via an interface 626. In one embodiment, the display device 640 includes, but is not limited to, liquid crystal display (LCD), cathode ray tube (CRT) display, or any other form of visual display device. In one embodiment of the invention, the processor 610 and the chipset 620 are merged into a SOC. In addition, the chipset 620 connects to one or more buses 650 and 655 that interconnect the various modules 674, 660, 662, 664, and 666. In one embodiment, buses 650 and 655 may be interconnected together via a bus bridge 672 if there is a mismatch in bus speed or communication protocol. In one embodiment, the chipset 620 couples with, but is not limited to, a non-volatile memory 660, a mass storage device(s) 662, a keyboard/mouse 664, and a network interface 666 via an interface 624.

In one embodiment, the mass storage device 662 includes, but is not limited to, a solid state drive, a hard disk drive, an universal serial bus flash memory drive, or any other form of computer data storage medium. In one embodiment, the network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although the cache memory 616 is depicted as a separate block within the processor 610, the cache memory 616 can be incorporated into the processor core 612 respectively. In one embodiment, the system 600 may include more than one processor/processing core in another embodiment of the invention.

The term operable used herein means that the device, module, system, logic unit, protocol etc, is able to operate or is adapted to operate for its desired functionality when the device, module, system, or logic unit is in off-powered state.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. For example, a memory module having an error pin other than a parity error pin (ALERT#) may be used for training (modifying) the C/A signal without initiating a JEDEC standardized initialization process. In one embodiment, the memory ranks $111_{1-N}$ are not confined within a memory module.

The embodiments of the invention are intended to embrace all such alternatives, modifications, and variations as to fall within the broad scope of the appended claims.

We claim:

1. A method comprising:
   transmitting from a memory controller a command-address (C/A) signal to a memory module;
   determining by the memory controller an error in the memory module via an error signal from an error pin of the memory module, the error associated with the C/A signal transmitted to the memory module; and
   adjusting the C/A signal, in response to determining the error in the memory module, by delaying a phase of the C/A signal with respect to a clock signal, wherein adjusting is performed by the memory controller.

2. The method of claim 1, wherein the error pin is a parity error pin of the memory module.

3. The method of claim 1, wherein the memory module comprises a Double Data Rate 4 (DDR4) interface.

4. The method of claim 1, wherein the memory module is a Dual In-Line Memory Module (DIMM) with a Dynamic Random Access Memory (DRAM).

5. The method of claim 1 further comprises:
   transmitting from the memory controller the adjusted C/A signal to the memory module.

6. The method of claim 5, further comprising:
   determining a phase setting for the C/A signal in response to determining the error in the memory module associated with the C/A signal and the adjusted C/A signal transmitted to the memory module; and
   assigning the phase setting by the memory controller to the C/A signal with respect to the clock signal of the memory controller.

7. The method of claim 6, wherein the phase setting is an average of phases of all correctly received C/A signals transmitted by the memory controller to the memory module, the received C/A signals including the C/A signal and the adjusted C/A signal.

8. The method of claim 1, further comprising resetting by the memory controller an error register associated with the error in the memory module.

9. The method of claim 1, further comprising modifying a control signal by the memory controller before modifying the C/A signal.

10. The method of claim 9, wherein the control signal is a chip-select signal.

11. A memory controller comprising:
    a transmitter operable to transmit a command-address (C/A) signal to a memory module; and
    a training logic unit operable to:
      determine by an error detection logic unit an error in the memory module via an error signal from an error pin of the memory module, the error associated with the C/A signal transmitted to the memory module; and
      adjust the C/A signal, in response to determining the error in the memory module, by delaying a phase of the C/A signal with respect to a clock signal.

12. The memory controller of claim 11, wherein the error pin is a parity error pin of the memory module.

13. The memory controller of claim 11, wherein the memory module comprises a Double Data Rate 4 (DDR4) input-output interface.

14. The memory controller of claim 11, wherein the memory module is a Dual In-Line Memory Module (DIMM) with a Dynamic Random Access Memory (DRAM).

15. The memory controller of claim 11, wherein the transmitter is further operable to transmit the adjusted C/A signal to the memory module.

16. The memory controller of claim 15, wherein the training logic unit is further operable to:
    determine by a phase setting logic unit a phase setting for the C/A signal in response to determining the error in the memory module associated with the C/A signal and the adjusted C/A signal transmitted to the memory module; and
    assign the phase setting to the C/A signal with respect to the clock signal.

17. The memory controller of claim 16 wherein the phase setting logic unit is further operable to compute an average of phases of all correctly received C/A signals transmitted by the memory controller to the memory module to determine the phase setting, the received C/A signals including the C/A signal and the adjusted C/A signal.

18. The memory controller of claim 11 further comprises a reset logic unit operable to reset an error register associated with the error in the memory module.

19. The memory controller of claim 11, wherein the training logic unit is further operable to modify a control signal before modifying the C/A signal.

20. A system comprising:
    a memory module having an error pin; and
    a memory controller communicatively coupled to the memory module, the memory controller including:
      a transmitter operable to transmit a command-address (C/A) signal to the memory module; and
      a training logic unit operable to:
        determine by an error detection logic unit an error in the memory module via an error signal from the error pin of the memory module, the error associated with the C/A signal transmitted to the memory module; and
        adjust the C/A signal, in response to determining the error in the memory module, by delaying a phase of the C/A signal with respect to a clock signal.

21. The system of claim 20, wherein the error pin is a parity error pin of the memory module.

22. The system of claim 20, wherein the memory controller is communicatively coupled to the memory module via a Double Data Rate 4 (DDR4) input-output interface.

23. The system of claim 20, wherein the memory module is a Dual In-Line Memory Module (DIMM) with a Dynamic Random Access Memory (DRAM).

24. The system of claim 20, wherein the transmitter is further operable to transmit the adjusted C/A signal to the memory module.

25. The system of claim 23, wherein the training logic unit is further operable to:
    determine by a phase setting logic unit a phase setting for the C/A signal in response to determining the error in the memory module associated with the C/A signal and the adjusted C/A signal transmitted to the memory module; and
    assign the phase setting to the C/A signal with respect to the clock signal.

26. The system of claim 25, wherein the phase setting logic unit is further operable to compute an average of phases of all correctly received C/A signals transmitted by the memory controller to the memory module to determine the phase setting, the received C/A signals including the C/A signal and the adjusted C/A signal.

27. The system of claim 20 further comprises a reset logic unit operable to reset an error register associated with the error in the memory module.

28. The system of claim 20, wherein the training logic unit is further operable to modify a control signal before modifying the C/A signal.

* * * * *